United States Patent
O'Riordan et al.

(12) 
(10) Patent No.: US 9,038,008 B1
(45) Date of Patent: May 19, 2015

(54) SYSTEM AND METHOD FOR CONTAINING ANALOG VERIFICATION IP

(71) Applicant: Cadence Design Systems, Inc., San Jose, CA (US)

(72) Inventors: Donald J. O'Riordan, Sunnyvale, CA (US); Jaideep Mukherjee, Los Altos, CA (US); Richard J. O'Donovan, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/231,410

(22) Filed: Mar. 31, 2014

Related U.S. Application Data

(63) Continuation-in-part of application No. 14/064,059, filed on Oct. 25, 2013.

(51) Int. Cl.
  *G06F 9/455* (2006.01)
  *G06F 17/50* (2006.01)
(52) U.S. Cl.
  CPC .................................. *G06F 17/5022* (2013.01)
(58) Field of Classification Search
  USPC ........................................................ 716/106
  See application file for complete search history.

(56) References Cited

U.S. PATENT DOCUMENTS

| | | |
|---|---|---|
| 8,533,647 B1 | 9/2013 | Gangadharan et al. |
| 8,682,631 B2 * | 3/2014 | Chang et al. ................... 703/13 |
| 2012/0198411 A1 * | 8/2012 | Bhushan et al. ............... 716/139 |

OTHER PUBLICATIONS

Ajeetha Kumari, "Property Specification Language Tutorial (Part 3)", PSL Reference Manual, Property Expressions: Verification Layer, Project VeriPage, PSL: Verification and Modeling Layers, Jun. 9, 2004, (6) pages.

"Separation of Concerns," http://en.wikipedia.org/wiki/Separation_of_concerns, last modified Mar. 16, 2014, pp. 1-7.

\* cited by examiner

*Primary Examiner* — Eric Lee
(74) *Attorney, Agent, or Firm* — Kenyon & Kenyon LLP

(57) ABSTRACT

A system, method, and computer program product for containing analog verification IP for circuit simulation. Embodiments introduce analog verification units ("vunits"), and corresponding analog verification files to contain them. Vunits allow circuit design verification requirement specification via text file. No editing of netlist files containing design IP is required to implement static and dynamic circuit checks, PSL assertions, clock statements, or legacy assertions. Vunits reference a top-level circuit or subcircuits (by name or by specific instance), and the simulator automatically binds vunit contents appropriately during circuit hierarchy expansion. Vunits may be re-used for other design cells, and may be easily processed by text-based design tools. Vunits may be provided via vunit_include statements in a control netlist file, command line arguments, or by directly placing a vunit block into a netlist. Vunits may also contain instance statements to monitor or process signals, such as those needed by assertions.

20 Claims, 9 Drawing Sheets

```
vunit ADC_Checker(ADC) {

//////////////////
// Dynamic Checks
//////////////////
dyn_floatdcpath node=["none"] inst=["*"] xinst=["none"] subckt=["*"] xsubckt=["none"] depth=8 error_limit=10000
dyn_highz node=["none"] duration=5e-9 time_window=[0 tend] vlth=0.200000 vhth=0.800000 inst=["*"] xinst=["none"] subckt=["*"] xsubckt=["none"] depth=8 error_limit=10000

//////////////////
// Static Checks
//////////////////
static_dcpath node=["none"] vlth=0.200000 vhth=0.800000 inst=["*"] xinst=["none"] subckt=["*"] xsubckt=["none"] depth=8 error_limit=10000

// PSL stability properties
// ensure the input is bounded to within +/- Vref/2.0 to avoid instability
vin_less_vref assert psl="assert always ('abs(V(X))' <= abs(V(Vref))/2.0')" @( 'timer(254.5*80e-9, 8*80e-9)' );"
message="vin_less_vref property failed" level=warning // check for actual instability. If integrator outputs exceed 1.5 times Vref
// the modulator is getting in trouble from a stability perspective
integ1_bounded assert psl="assert never 'abs(V(I1)) > 1.5*V(Vref)' @( 'timer(254.5*80e-9, 8*80e-9)' );"
message="integ1_bounded property failed" level=warning
integ2_bounded assert psl="assert never 'abs(V(I2)) > 1.5*V(Vref)' @( 'timer(254.5*80e-9, 8*80e-9)' );"
message="integ2_bounded property failed" level=warning
}
```

FIG. 3

SYSTEM AND METHOD FOR CONTAINING ANALOG VERIFICATION IP

CROSS-REFERENCE TO RELATED APPLICATIONS

The present application is a continuation-in-part of U.S. patent application Ser. No. 14/064,059, entitled "System and Method for Analog Verification IP Authoring and Storage", filed on Oct. 25, 2013. This related application is hereby incorporated by reference in its entirety.

FIELD OF THE INVENTION

This patent application relates to the field of circuit simulation, and more precisely to more easily managing verification-related information for analog and mixed-signal circuit designs.

BACKGROUND

The re-use of circuit designs has become an important trend in the integrated circuit design industry. Companies may exchange or license design intellectual property (or "design IP"), typically including schematic and layout information for commonly used circuit blocks. The creation of a new integrated circuit may thus be greatly simplified by assembling pre-designed circuit blocks into a nearly complete system, with minimal new design effort required.

Verification is an important step in the process of designing and creating an electronic product. Verification helps ensure that the electronic design will work for its intended purpose, and is usually performed at several stages of the electronic design process. Circuit designers and verification engineers use different methods and analysis tools to verify circuit designs, including simulation. Simulation verifies a design by monitoring computed behaviors of the design with respect to test stimuli. Circuit performance measurements may be performed by a post-simulation engine that evaluates simulated circuit waveforms. A variety of commercially offered software programs are available for circuit simulation.

Digital and mixed-signal simulators support a concept known as a verification unit (or "vunit'" in Property Specification Language (PSL), or the System Verilog Assertions (SVA) "bindfile" equivalent). Verification units are containers of properties that describe the verification requirements of a circuit design. Verification units in the verification domain are thus rather analogous to modules or subcircuits, which are used to capture design information in the design domain. Verification units however capture verification information in a standalone entity or separate file from the circuit design itself During simulation, the contents of a verification unit may be considered alongside corresponding modules or subcircuits of a circuit design, sometimes on a per-instance basis. In analog design, verification is currently far more limited.

Low level analog and mixed-signal circuit operations are commonly verified during simulation by performing various device checks, such as checking that individual transistors are operating within their specified Safe Operating Area (SOA). More recently, a different level of simulator dynamic checking has evolved, known generally as circuit checks, in which the functionality of a group of devices or connectivity is checked all at once. Circuit checks may be run for example to look for high impedance nodes, DC leakage paths to ground, and other commonly occurring problems. Both static and dynamic types of checks are available in newer analog simulators. Analog functional block checking has also become enabled recently within some analog simulators, e.g., PSL and/or SVA temporal assertions may now be applied to analog circuit objects. All of the various types of checks used to verify circuit operation may be included in verification intellectual property (or "verification IP").

Traditionally, analog verification using SPICE simulation has involved the creation of a single netlist file containing the circuit connectivity and the analysis statements (e.g., AC, DC, TRAN, etc.) to be run to produce output waveforms. Waveform post-processing may then verify the design. Newer generations of SPICE-type simulators now perform many of these verification checks more efficiently within the simulator itself. Even more recently, analog assertion checks have been introduced.

The netlist informs the simulator what needs to be checked, and how. In some tools, a user typically must manually edit the various checks and verification statements into the circuit netlist file produced by the design environment. Such hand editing requires simulator netlist language level skills, e.g., user understanding of the syntax and semantics of the checks to be performed, and is error prone. Syntactically, SPICE simulators require the checks to be specified as single statements, which may either be placed at the top level of the circuit hierarchy, or within subcircuit definitions (to bound their scope).

This verification approach made sense when there was just one check to be performed, or one type of check, but now there are many different types of checks, and often many instances of each check type. The result can be a netlist file that contains a plethora of check statements, often interspersed around the netlist file. Verification management has become a noticeable issue, with limitations making it difficult to add, disable, or remove checks after they have been initially created by a netlisting system.

A testbench-based approach could be extended to address such complexity. There are some major disadvantages to testbench level checks, however. For example, such an approach does not promote re-use of the verification IP beyond that immediate testbench. Testbench level checks also do not work when the block being checked is hierarchically integrated into a different context (e.g., when it is integrated as a component of a bigger circuit). Testbench based verification data may also get out of synch with the design, or may be lost entirely.

As a result, in current practice, analog verification IP does not naturally travel with the design block in an IP integration use scenario. Significant confusion may persist about what has been tested, and under what assumptions it has been tested. The process of analog design integration suffers as a result.

Thus a need exists for an improved approach to management of verification IP. Accordingly, the inventors have developed a novel way to help circuit designers create, store, and maintain verification IP for analog and mixed-signal circuit designs.

BRIEF DESCRIPTION OF THE DRAWINGS

FIG. 3 is a diagram of an analog verification or "vunit" file listing, according to an embodiment.

DETAILED DESCRIPTION

This description presents a system, method, and computer program product for containing analog verification IP for use in circuit simulators. Embodiments introduce analog verification units (or simply "vunits" in this description), and corresponding analog verification files to contain them, as new separate entities (with syntax and semantics) for SPICE-type circuit simulators. Analog vunits allow the user to specify the verification requirements of a circuit design in a text file for example that may be easily read and processed. No extensive manual editing of netlist files containing design IP is required to implement static and dynamic circuit checks, PSL assertions, clock statements, or legacy assertions.

Analog verification units may reference a top-level circuit or subcircuits (by name or by specific instance), and the simulator may automatically bind vunit contents appropriately during circuit hierarchy expansion. References to signals or objects in any statements in the analog verification units may be bound to the corresponding SPICE subcircuit signals or objects as appropriate. The analog verification units may be re-used for other design cells, and may be easily processed by text-based design tools. Analog vunits may be linked to simulators by vunit_include statements in a control netlist file, by command line arguments, or by directly placing a vunit block into a netlist. Analog vunits may also contain instance statements to monitor or process signals, such as those needed by assertions.

The prior art allowed for separate disparate check statements that were manually placed or included into SPICE netlists, however this approach provides no method to group or contain related checks and deal with them as a whole. The related application previously incorporated by reference describes the concept of maintaining verification IP separately from, but in conjunction with, design IP. This concept was implemented essentially as a verification IP cellview that parallels the schematic design IP cellview. Both views relate to the same cell in a library structure, but have different contents and intent.

Figure 1:
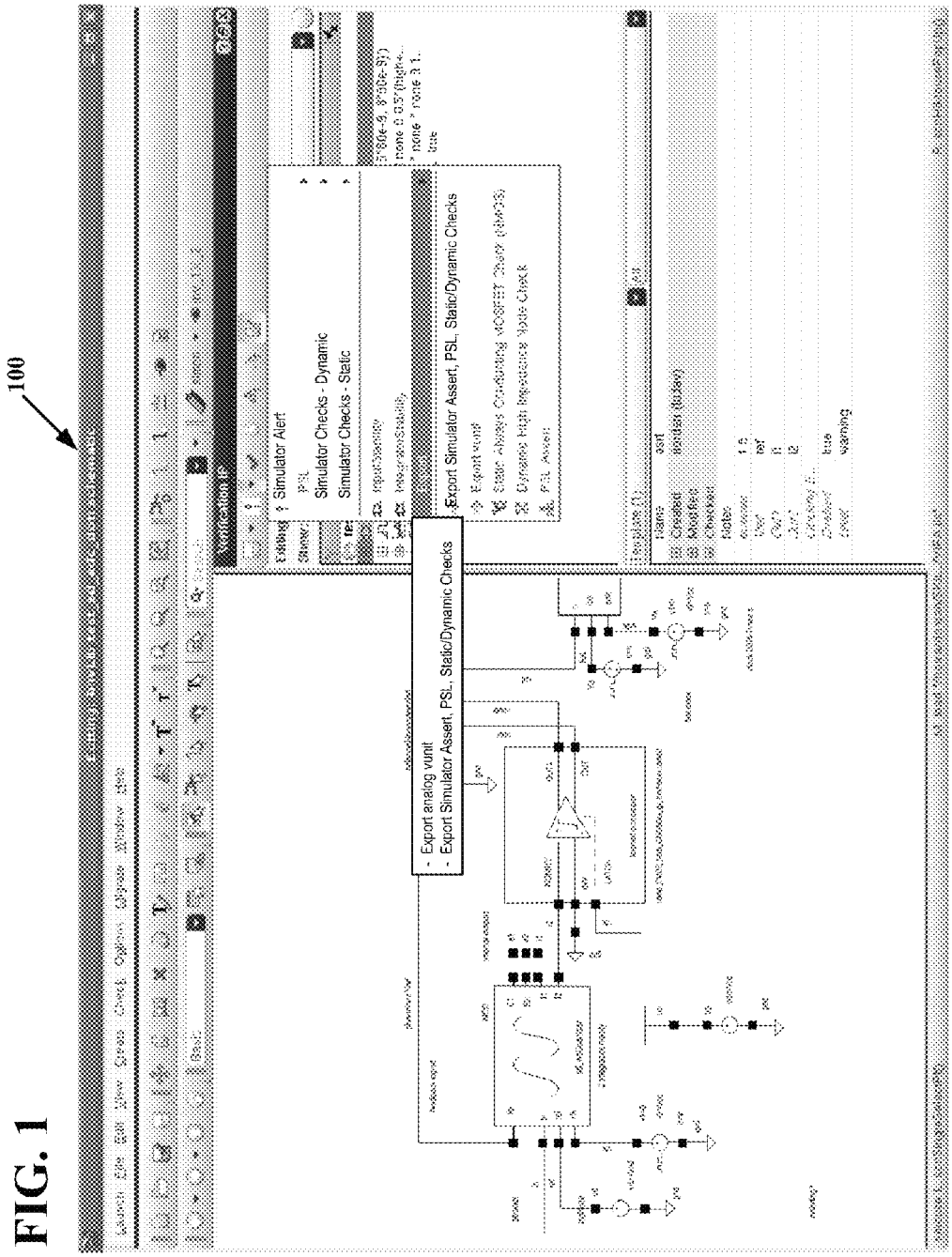
FIG. 1 is a diagram of a verification IP design tool user interface with analog vunit export capability, according to an embodiment.

FIG. 1 shows a verification IP design tool user interface 100 with analog vunit export capability, according to an embodiment. This design tool may manage verification IP in a verification view that is a sibling view of the cell's schematic and layout cellviews. The user interface may now further provide the user with an option to export analog verification IP for use with various simulators or other tools. The analog verification IP may comprise static and dynamic simulator checks, PSL or other assertions, and circuit checks for example. In one embodiment, the analog verification IP may be exported as a verification unit file or vunit file.

Via the embodiments now provided, vunits dedicated to analog verification IP allow for self-containment of all verification IP associated with a given design cell. Support for analog vunits allows a design tool suite to easily export its analog and mixed-signal verification IP cellview contents in a form that may be readily consumed by all analog circuit simulators in the design tool suite. For example, SPICE-type circuit simulators using this approach may establish a direct 1:1 translation from verification IP views to analog verification units, simplifying and improving the handling of the checks in these flows.

While the analog verification unit in some aspects parallels the PSL "vunit" or SystemVerilog "bindfile" concepts that have been used in the digital environment, the analog verification units contain a richer set of statements and semantic content including:

Static (testbench-independent) Circuit Checks
Dynamic (testbench-dependent) Circuit Checks
Auxilliary Instance statements
PSL and SVA assertions
Default clocks statements
Safe-Operating-Area style device assertions
Standard simulator comments may also be supported, e.g.: //some comment.

The auxiliary instance statements are not design instances per se, but may be instances of special "monitor" blocks that monitor signals, and perhaps produce outputs that are derived expressions/measurements based on those signals. These monitor blocks may often be implemented in Verilog-A. The derived signals are usually checked in various assertions that are also present within the analog vunit.

Analog verification units refer to SPICE subcircuits by name (using the SPICE namespace), or instances of SPICE subcircuits (again using the SPICE namespace). The SPICE simulator reads analog verification units, and may automatically bind their contents to the appropriate SPICE subcircuits as part of the circuit hierarchy expansion, e.g., during or after parsing the netlist, but before any analyses are performed. Any references to signals or objects within any of the statements contained within the analog verification units may be bound to the corresponding SPICE subcircuit signals or objects, relatively, as appropriate.

In addition, the analog verification units are self-contained and may encapsulate all of the checks that apply to a given design cell, making it easy to re-use these checks later in different contexts by simply binding them to a different design cell (e.g., a cell variant in a spin-off design). The ease of use of analog verification units additionally allows text-based tools and flows to process them.

The vunit contents may include additional instances (e.g., instances of auxiliary modules that calculate an output that is to be checked) along with the primary verification content that comprises various kinds of checks and assertions. Vunits are an implementation of the "separation of concerns" design principle for separating a computer program into distinct modular sections, each addressing a particular issue.

Analog vunits may be specified in separate files. In one embodiment, the vunit file syntax may closely mirror Verilog vunit files to keep flows as consistent as possible. Analog vunits may be specified in files having a predetermined filename extension for easy identification (e.g., ".sys").

SPICE-type simulators may support several different ways of specifying vunit information:
  Via vunit_include statements within a control netlist file (e.g., a filename with an ".scs" extension).
  By directly placing a vunit block into a SPICE netlist, which requires modification of the SPICE netlist parser.

Via +vunit <vunit_file.sys>, a command line argument. This command line argument may be repeated multiple times, e.g., it allows multiple vunit files to be specified as in:

<simulatorname>design.scs +vunit my_vunit1.sys +vunit my_vunit2.sys

A vunit may be described in this format:
vunit v0{
//v0's primary contents here
}//vunit v0

The above example specifies a vunit named v0. The beginning and ending of the vunit may be denoted by curly brace delimiters { }. The primary contents may be placed between those delimiters.

The contents of a vunit may further be bound to a subcircuit definition (e.g., spanning all of its instances), or to one or more specific hierarchical instances:
vunit v1 (subcircuit_name){
//binds to all occurrences of subcircuit_name
}//v1
vunit v2 (top.chip.ctl_unit.pkt_processor){
//binds only to one specific hierarchical instance of a subcircuit
}//v2

The first example above may bind v1 to all instances of a subcircuit called subcircuit_name. The second example above may bind v2 only to the specific hierarchical instance top.chip.ctl_unit.pkt_processor.

When no subcircuit name or instance list is specified, the vunit contents may be stitched onto the simulator top level circuit, as is the case for v0 in the above examples.

The effect of the binding is to allow the contents of a vunit to reference objects within the associated SPICE subcircuit (or top level circuit), such as nodes, instances, and parameters.

The vunit contents may be "stitched" by the simulator onto the top level circuit, specified subcircuit master, or specified subcircuit instances. Note that the instance statements and various checks and assertions within the vunit may reference objects (e.g., most commonly node names, but also instances or parameters) specified/scoped with the correspondingly bound subcircuit or simulator top level circuit.

Figure 2:
FIG. 2 is a diagram of a verification testbench listing, according to an embodiment.

FIG. 2 shows a verification testbench listing 200, according to an embodiment. A testbench may define parameters and test stimuli to be applied to a device or circuit under test, and statements specifying the simulations that are to be performed. Simulation results may be examined manually or with post-processing tools, and may include various checks and assertions intended to note specified anomalous simulation results.

The simulator testbench listing 200 shows a file listing (e.g., ADC_Testbench.scs file) that defines some parameters and then defines a subcircuit, ADC. The subcircuit ADC includes an analog modulator mod1 and a digital filter df1. The testbench then instantiates a copy of ADC as instance i1, and provides a stimulus source v1. The testbench also includes an exemplary PSL assertion "vin_less_vref" and a transient analysis statement "timedom" the simulator will use to put the subcircuit to the test.

FIG. 2 thus represents the testbench approach to managing design IP and verification IP, which may be supported by circuit simulators that can process analog verification IP. This approach does not however promote re-use of the verification IP beyond that particular testbench. Testbench level checks also may not work when the block being checked is hierarchically integrated into a different context (e.g., when the subcircuit is integrated as a component of a bigger circuit). The embodiments of the present invention address these issues.

FIG. 3 shows an analog verification file or vunit file listing 300, according to an embodiment. In contrast to the testbench approach, in this case an adc_checker.sys vunit file is used for verification IP management. This file is intended to check or verify the operation of the ADC subcircuit (e.g., the design IP). In other words, it represents the verification IP that may for example have been exported from a design tool suite used to create the design IP. Note that the same ADC subcircuit master name may be specified within parentheses after the vunit name ADC_Checker itself.

The ADC_Checker vunit also contains references to objects within the ADC subcircuit to which it is bound. For example, the PSL assertions (e.g., vin_less_vref, integ1_bounded, and integ2_bounded) refer to the following nodes within the ADC subcircuit: X, Vref, I1, I2.

Figure 4:
FIG. 4 is a diagram of an effective equivalent subcircuit listing with the analog verification or vunit file applied, according to an embodiment.

The effect of applying/binding this vunit to the ADC subcircuit master is identical to that achieved by specifying the contents of the vunit directly within the ADC subcircuit master itself. Thus, it is as if the ADC subcircuit were written as shown in FIG. 4, with the relevant section between the subckt/ends keywords denoted by a dashed rectangle. FIG. 4 thus shows an effective equivalent subcircuit listing 400 with the analog verification file or vunit file applied, according to an embodiment.

FIG. 4 denotes the direct 1:1 relationship established by the embodiments between vunits and the circuits or subcircuits to which they are bound. Unlike prior art approaches, no extensive manual editing of netlists is required to incorporate potentially complex verification IP into potentially complex design IP.

Note also that should any instance or node names be specified to say the "node" or "inst/xinst/subckt/xsubckt" parameters of the static/dynamic checks (e.g., static_dcpath, dyn_highz, and dyn_floatdcpath) within the vunit, those instance or node names will be interpreted as relative to the associated ADC subcircuit (or top-level instance if no binding argument is specified to the vunit).

Figure 5:
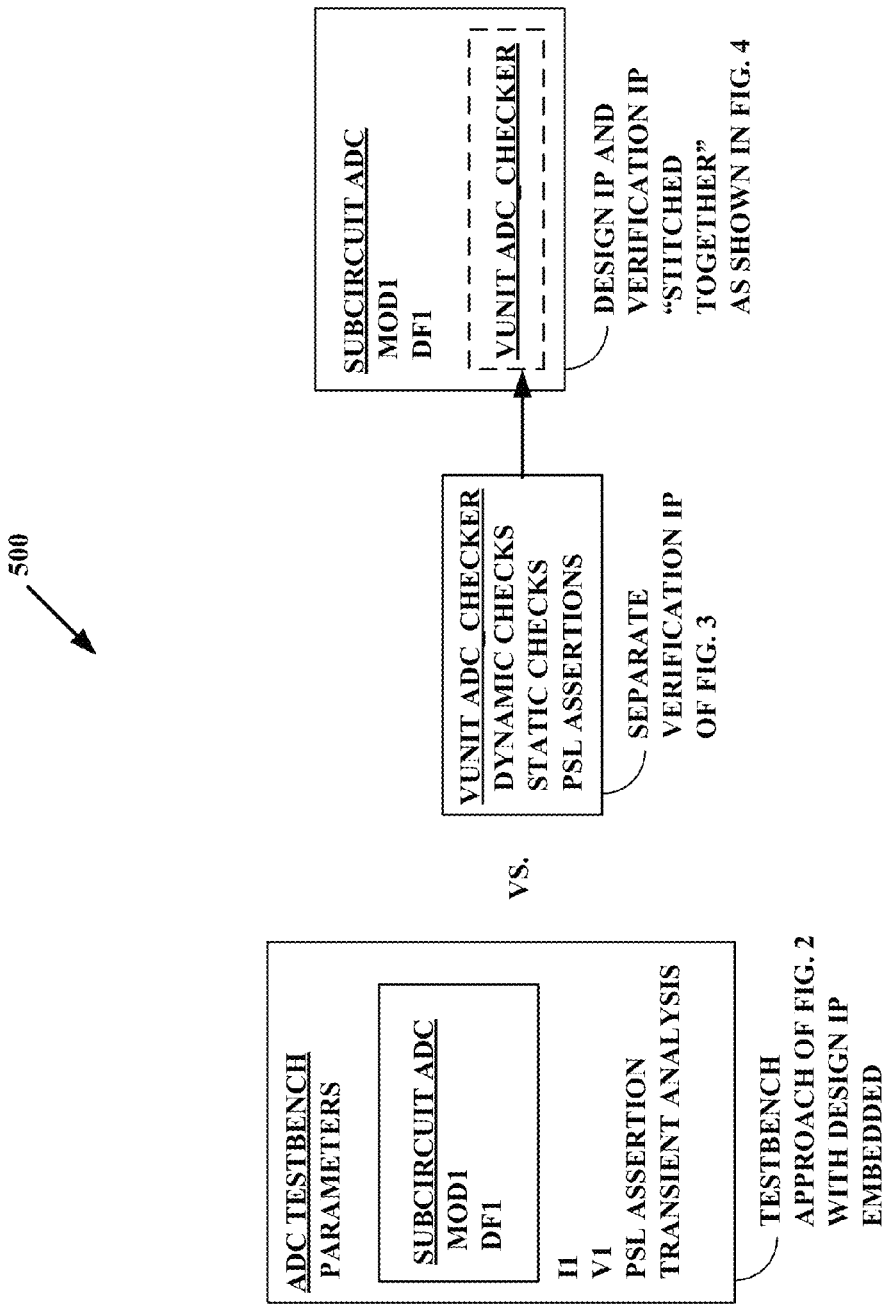
FIG. 5 is a diagram of contrasting analog verification IP management approaches, according to an embodiment.

FIG. 5 summarizes the contrasting analog verification IP management approaches 500 described above, according to an embodiment. The testbench scenario embeds the design IP into a specific circuit environment that is intended to verify some aspect of its behavior via simulation. In contrast, the analog verification unit approach allows all aspects of the verification IP to be contained in a vunit. The vunit may have been generated and exported by a design tool suite used to generate the design IP, or may have been separately created. A simulator may incorporate the vunit into the design IP, to effectively coherently "stitch together" the design and verification aspects of a circuit design.

Figure 6:
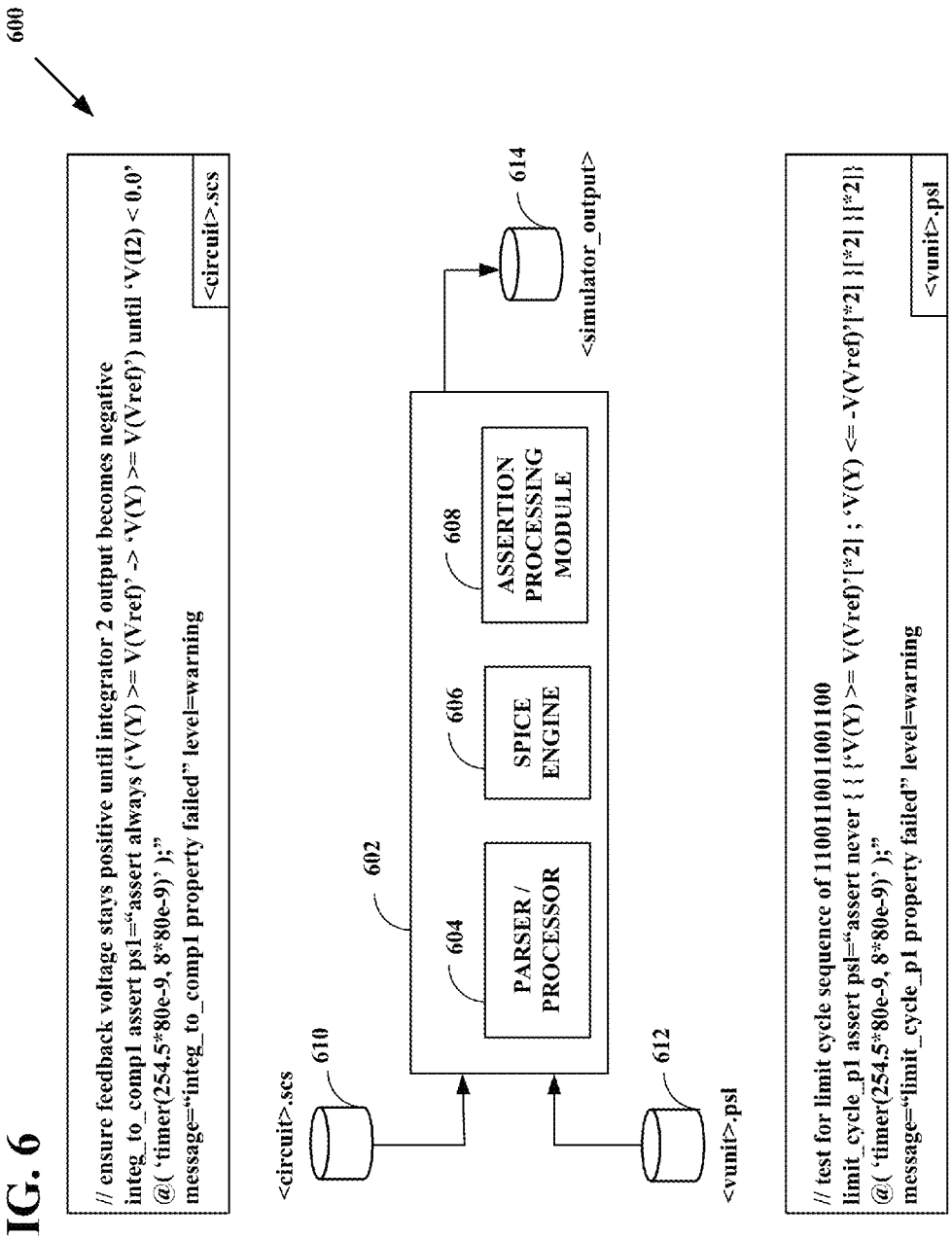
FIG. 6 is a diagram of an augmented simulation engine, according to an embodiment.

FIG. 6 shows a diagram 600 of an augmented simulation engine 602, comprising a parser/processor 604, an exemplary SPICE engine 606, and an assertion processing module 608. A control netlist file, <circuit>.scs 610, may represent a typical input file describing design IP. Another input file, <vunit>.ps1 612, may represent the separate analog verification IP file previously described, which complements the design IP file. Parser/processor 604 may read both files 610 and 612 and produce combined input to be processed. The simulator engine 606 may perform the required simulation, and the assertion processing module 608 may write the assertion results to the simulator output 614.

Figure 7:
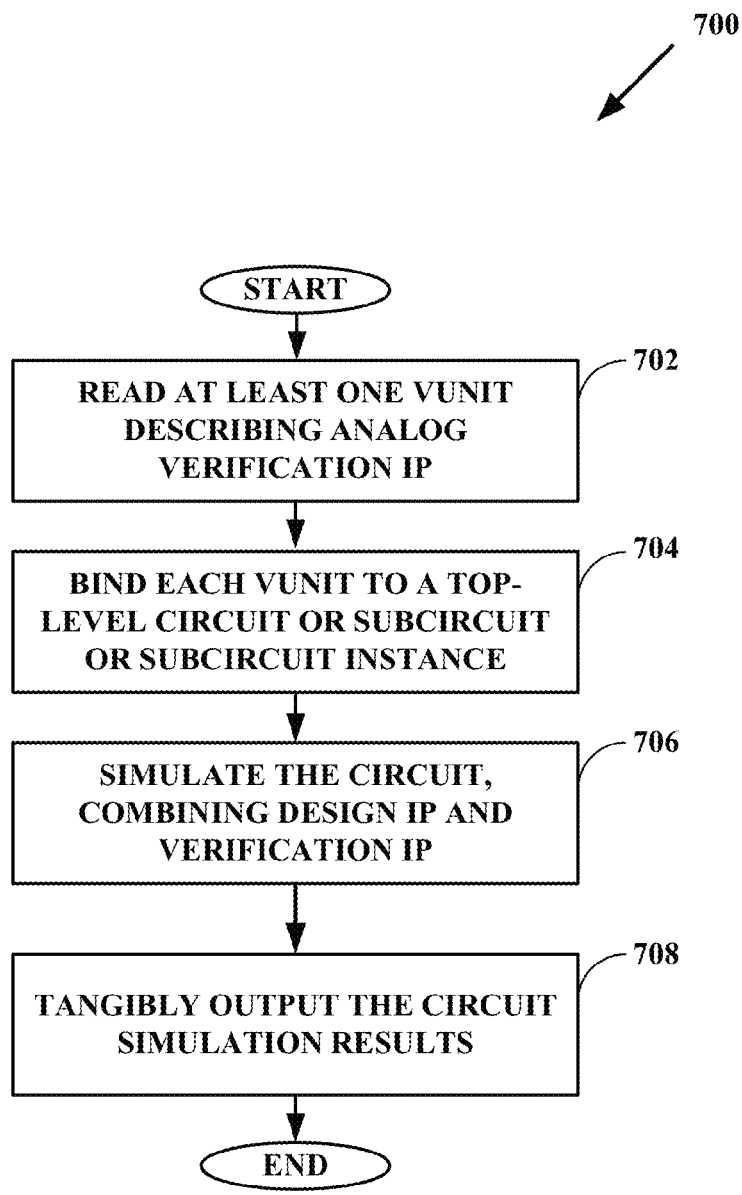
FIG. 7 is a flowchart of analog verification IP processing, according to an embodiment.

FIG. 7 shows a flowchart 700 of analog verification IP processing, according to an embodiment. At 702, the method may read a vunit that contains properties describing analog circuit design verification requirements. The vunit may be provided by a vunit_include statement in a control netlist file, a command line argument, or a vunit block placed directly into a netlist. The vunit may be a text file, and may have been generated for use with a previous design cell or for a previous circuit design. Likewise, the vunit may be re-used in the future for another design cell or circuit design. The vunit may have been outputted by a design tool that processes design IP and verification IP in separate cellviews.

At 704, the method may bind the vunit to one of a top-level circuit and a subcircuit, for example during circuit hierarchy expansion prior to performing any analyses. The vunit may be bound to particular instances of a subcircuit also. References to signals or objects in any statements in the analog verification units may be bound to the corresponding subcircuit signals or objects, so that the scope of the vunit is set appropriately.

At 706, the method may perform a circuit simulation, using a SPICE-type circuit simulator for example. The circuit simulator combines the circuit design specifications (e.g., the design IP) and the analog circuit design verification requirements (e.g., the verification IP) by stitching together both aspects of the circuit design. At 708, the circuit simulator may tangibly output the circuit simulation results.

Figure 8:
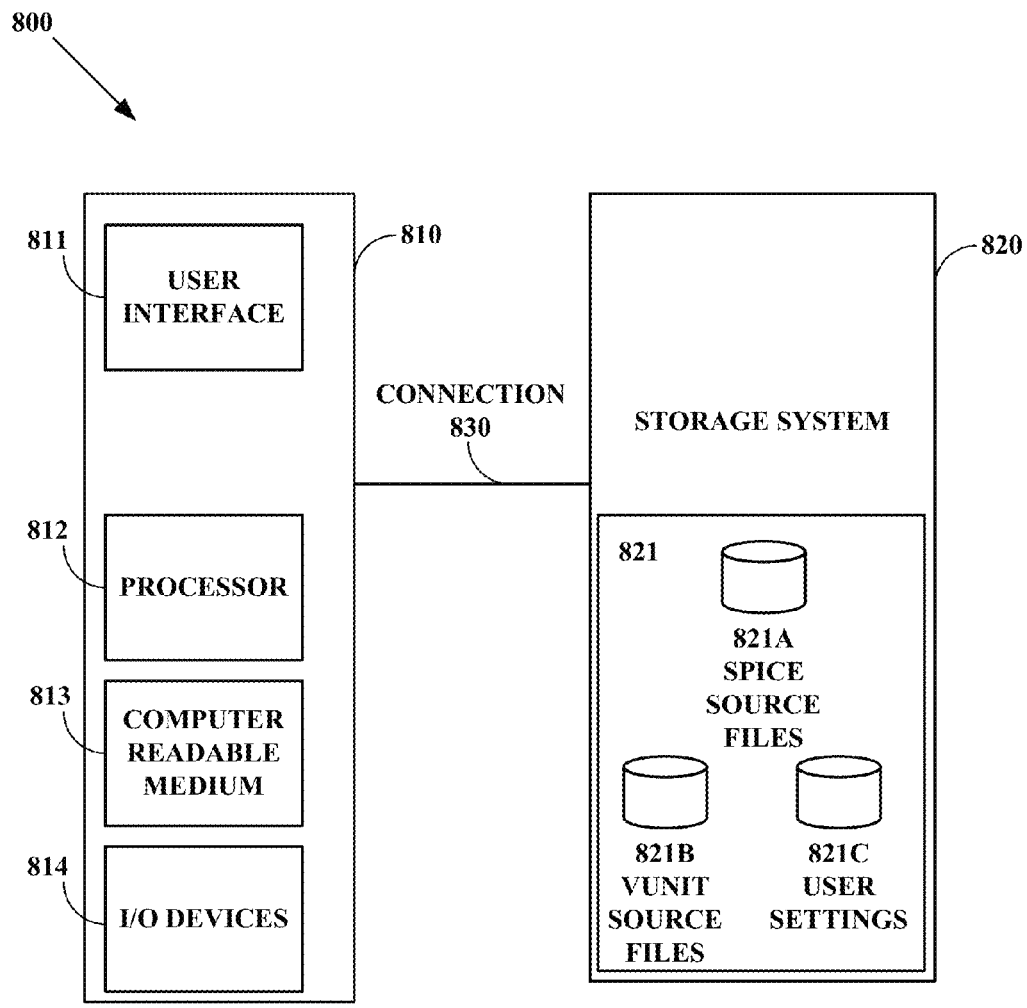
FIG. 8 is a block diagram of a circuit analysis system, according to an embodiment.

FIG. 8 shows a block diagram of an exemplary circuit analysis system 800, according to an embodiment. This system may provide simulator functionality for any of the methods described above. A user may access the system 800 through a standalone client system, client-server environment, or a network environment. System 800 may comprise one or more clients or servers 810, one or more storage systems 820, and a connection or connections 830 between and among these elements.

Client 810 may execute instructions stored on transitory or non-transitory computer readable medium 813 with processor 812, and may provide a user interface 811 to allow a user to access storage system 820. The instructions may be part of a software program or executable file that may operate electronic design automation (EDA) software. Client 810 may be any computing system, such as a personal computer, workstation, mobile computer, or other device employing a processor which is able to execute programming instructions. User interface 811 may be a GUI run in a user-controlled application window on a display. A user may interact with user interface 811 through one or more input/output (I/O) devices 814 such as a keyboard, a mouse, or a touch screen.

Storage system 820 may take any number of forms, including but not limited to a server with one or more storage devices attached to it, a storage area network, or one or a plurality of non-transitory computer readable media. Databases 821 may be stored in storage system 820 such that they may be persistent, retrieved, or edited by the user. Databases 821 may include SPICE source files 821A, vunit source files 821B, and a user input database 821C for example. These databases may be kept as separate files or systems, or may be merged together in any appropriate combination.

Only one client 810 is shown connected to storage system 820 through connection 830, which may be a simple direct wired or wireless connection, a system bus, a network connection, or the like, to provide client 810 with access to storage system 820. In another aspect, connection 830 may enable multiple clients 810 to connect to storage system 820. The connection may be part of a local area network, a wide area network, or another type of network, again providing one or more clients with access to storage system 820. Depending on system administrator settings, client 810's access to system storage 820 or to other clients may be limited.

Figure 9:
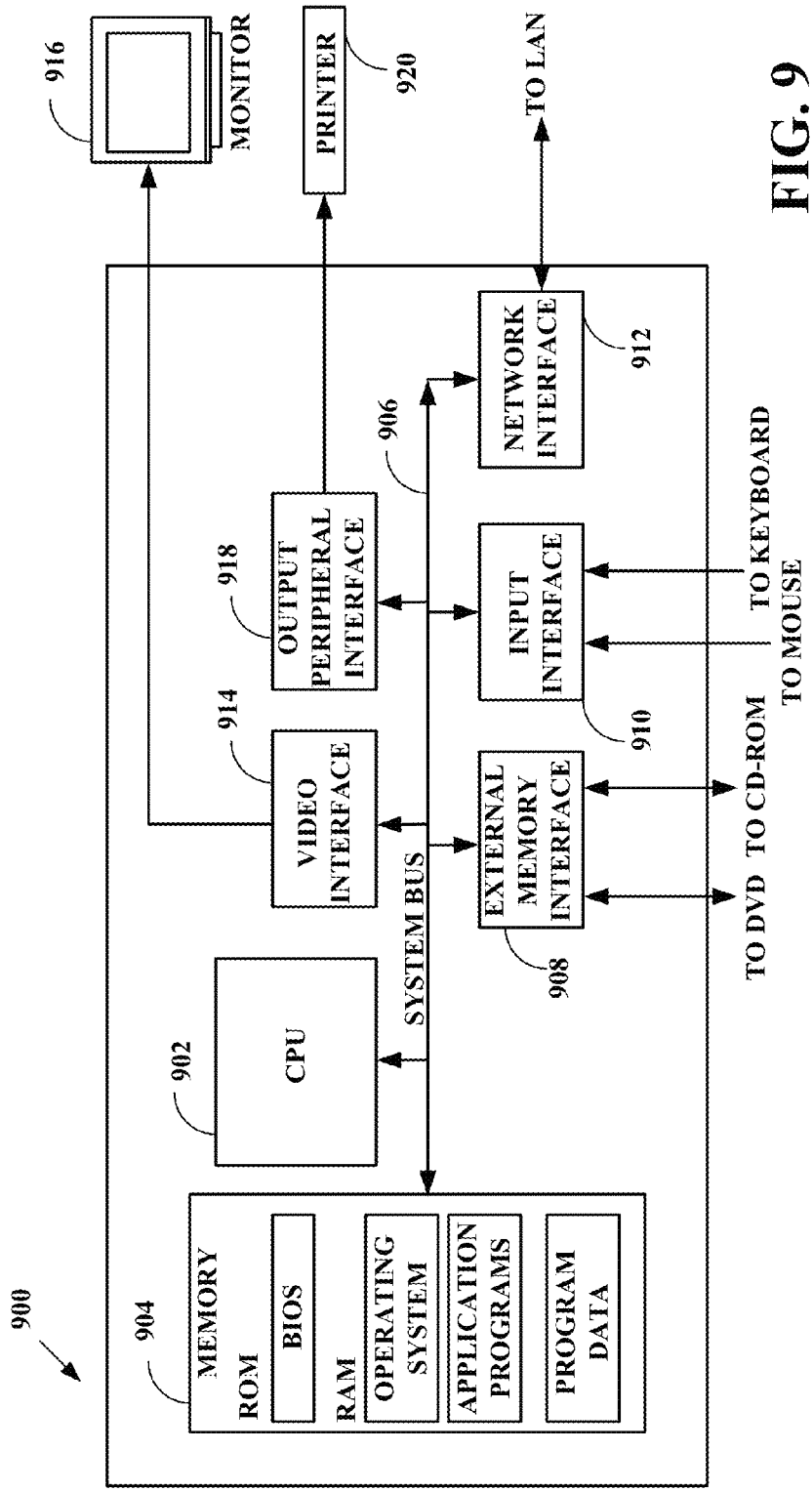
FIG. 9 is a diagram of a computer system, according to an embodiment.

FIG. 9 depicts a computer system comprising the structure for implementation of the embodiments described above. Computer system 900 comprises a central processing unit (CPU) 902 that processes data stored in memory 904 exchanged via system bus 906. Memory 904 typically includes read-only memory, such as a built-in operating system, and random-access memory, which may include an operating system, application programs, and program data. Computer system 900 also comprises an external memory interface 908 to exchange data with a DVD or CD-ROM for example. Further, input interface 910 may serve to receive input from user input devices including but not limited to a keyboard and a mouse. Network interface 912 may allow external data exchange with a local area network (LAN) or other network, including the internet. Computer system 900 also typically comprises a video interface 914 for displaying information to a user via a monitor 916. An output peripheral interface 918 may output computational results and other information to output devices including but not limited to a printer 920.

Computer system 900 may comprise for example a personal computer or an engineering workstation, each of which is widely known in the art and is commonly used for integrated circuit design tasks, along with software products commercially available for performing computer-aided integrated circuit design tasks. Computer system 900 may also comprise a mobile computer, including for example a tablet computer or a smart phone. The computer system of FIG. 9 may for example receive program instructions, whether from existing software products or from embodiments of the present invention, via a computer program product and/or a network link to an external site.

For purposes of explanation, specific nomenclature is set forth to provide a thorough understanding of the present invention. Description of specific applications and methods are provided only as examples. Various modifications to the embodiments will be readily apparent to those skilled in the art and the general principles defined herein may be applied to other embodiments and applications without departing from the spirit and scope of the invention. Thus the present invention is not intended to be limited to the embodiments shown, but is to be accorded the widest scope consistent with the principles and steps disclosed herein.

As used herein, the terms "a" or "an" shall mean one or more than one. The term "plurality" shall mean two or more than two. The term "another" is defined as a second or more. The terms "including" and/or "having" are open ended (e.g., comprising). Reference throughout this document to "one embodiment", "certain embodiments", "an embodiment" or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation. The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

In accordance with the practices of persons skilled in the art of computer programming, embodiments are described with reference to operations that may be performed by a computer system or a like electronic system. Such operations are sometimes referred to as being computer-executed. It will be appreciated that operations that are symbolically represented include the manipulation by a processor, such as a central processing unit, of electrical signals representing data bits and the maintenance of data bits at memory locations, such as in system memory, as well as other processing of signals. The memory locations where data bits are maintained are physical locations that have particular electrical, magnetic, optical, or organic properties corresponding to the data bits.

When implemented in software, the elements of the embodiments may serve as the code segments directing a computing device to perform the necessary tasks. The non-transitory code segments may be stored in a processor readable medium or computer readable medium, which may include any medium that may store or transfer information. Examples of such media include an electronic circuit, a semiconductor memory device, a read-only memory (ROM), a flash memory or other non-volatile memory, a floppy diskette, a CD-ROM, an optical disk, a hard disk, a fiber optic medium, etc. User input may include any combination of a keyboard, mouse, touch screen, voice command input, etc. User input may similarly be used to direct a browser application executing on a user's computing device to one or more network resources, such as web pages, from which computing resources may be accessed.

While particular embodiments of the present invention have been described, it is to be understood that various different modifications within the scope and spirit of the invention will be apparent to ordinarily skilled artisans. The invention is limited only by the scope of the appended claims.

What is claimed is:

1. A method for containing analog verification intellectual property (IP) for circuit simulation, the method comprising:
    using a computer, reading an analog verification file containing at least one analog verification unit (vunit) that contains properties describing analog circuit design verification requirements including checks for specified simulation results, wherein the analog verification file is separate from input design IP;
    binding the vunit to one of a top-level circuit, a subcircuit master, and a subcircuit instance during circuit hierarchy expansion, to set vunit scope;
    performing a circuit simulation with a computer-operated circuit simulation tool combining the input design IP and the analog circuit design verification requirements; and
    tangibly outputting circuit simulation and verification results.

2. The method of claim 1 wherein a design tool that processes the input design IP and the analog circuit design verification requirements in separate cellviews generates the analog circuit design verification requirements.

3. The method of claim 1 wherein the vunit is a text file.

4. The method of claim 1 wherein the vunit contents comprise at least one of static circuit checks, dynamic circuit checks, PSL assertions, clock statements, legacy assertions, and auxiliary instance statements that monitor signals and produce derived outputs.

5. The method of claim 1 wherein the vunit is re-used.

6. The method of claim 1 wherein the circuit simulation tool reads the vunit by at least one of a vunit_include statement in a control netlist file, a command line argument, and a vunit block placed directly into a netlist.

7. The method of claim 1 wherein the circuit simulation tool, via the vunit, coordinates the input design IP and the analog circuit design verification requirements with no manual netlist editing.

8. A non-transitory computer readable medium storing instructions that, when executed by a processor, perform a method for containing analog verification intellectual property (IP) for circuit simulation, the method comprising:
    using a computer, reading an analog verification file containing at least one analog verification unit (vunit) that contains properties describing analog circuit design verification requirements including checks for specified simulation results, wherein the analog verification file is separate from input design IP;
    binding the vunit to one of a top-level circuit, a subcircuit master, and a subcircuit instance during circuit hierarchy expansion, to set vunit scope;
    performing a circuit simulation with a computer-operated circuit simulation tool combining the input design IP and the analog circuit design verification requirements; and
    tangibly outputting circuit simulation and verification results.

9. The medium of claim 8 wherein a design tool that processes the input design IP and the analog circuit design verification requirements in separate cellviews generates the analog circuit design verification requirements.

10. The medium of claim 8 wherein the vunit is a text file.

11. The medium of claim 8 wherein the vunit contents comprise at least one of static circuit checks, dynamic circuit checks, PSL assertions, clock statements, legacy assertions, and auxiliary instance statements that monitor signals and produce derived outputs.

12. The medium of claim 8 wherein the vunit is re-used.

13. The medium of claim 8 wherein the circuit simulation tool reads the vunit by at least one of a vunit_include statement in a control netlist file, a command line argument, and a vunit block placed directly into a netlist.

14. The medium of claim 8 wherein the circuit simulation tool, via the vunit, coordinates the input design IP and the analog circuit design verification requirements with no manual netlist editing.

15. A system comprising:
    a non-transitory memory storing executable instructions; and
    a processor executing the instructions to perform a method for containing analog verification intellectual property (IP) for circuit simulation, the method comprising:
        using a computer, reading an analog verification file containing at least one analog verification unit (vunit) that contains properties describing analog circuit design verification requirements including checks for specified simulation results, wherein the analog verification file is separate from input design IP;
        binding the vunit to one of a top-level circuit, a subcircuit master, and a subcircuit instance during circuit hierarchy expansion, to set vunit scope;
        performing a circuit simulation with a computer-operated circuit simulation tool combining the input design IP and the analog circuit design verification requirements; and
        tangibly outputting circuit simulation and verification results.

16. The system of claim 15 wherein a design tool that processes the input design IP and the analog circuit design verification requirements in separate cellviews generates the analog circuit design verification requirements.

17. The system of claim 15 wherein the vunit is a text file.

18. The system of claim 15 wherein the vunit contents comprise at least one of static circuit checks, dynamic circuit checks, PSL assertions, clock statements, legacy assertions, and auxiliary instance statements that monitor signals and produce derived outputs.

19. The system of claim 15 wherein the circuit simulator reads the vunit by at least one of a vunit_include statement in a control netlist file, a command line argument, and a vunit block placed directly into a netlist.

20. The system of claim 15 wherein the circuit simulation tool, via the vunit, coordinates the input design IP and the analog circuit design verification requirements with no manual netlist editing.

* * * * *